United States Patent
Landatxe Zugarramurdi et al.

(10) Patent No.: US 10,732,136 B2
(45) Date of Patent: Aug. 4, 2020

(54) METHOD FOR DETECTING WATER IN DIESEL FUEL FILTERS AND WATER SENSOR FOR CARRYING OUT SAID METHOD

(71) Applicant: CEBI ELECTROMECHANICAL COMPONENTS SPAIN, S.A., Villatuerta (Navarra) (ES)

(72) Inventors: Jose Luis Landatxe Zugarramurdi, Villatuerta (ES); Sergio Diez Garcia, Villatuerta (ES)

(73) Assignee: CEBI ELECTROMECHANICAL COMPONENTS SPAIN, S.A., Villatuerta (Navarra) (ES)

( * ) Notice: Subject to any disclaimer, the term of this patent is extended or adjusted under 35 U.S.C. 154(b) by 35 days.

(21) Appl. No.: 16/091,851

(22) PCT Filed: Apr. 6, 2017

(86) PCT No.: PCT/ES2017/070214
§ 371 (c)(1),
(2) Date: Oct. 5, 2018

(87) PCT Pub. No.: WO2017/178678
PCT Pub. Date: Oct. 19, 2017

(65) Prior Publication Data
US 2019/0086353 A1    Mar. 21, 2019

(30) Foreign Application Priority Data
Apr. 11, 2016 (ES) .................................. 201630445

(51) Int. Cl.
G01N 27/22 (2006.01)
G01R 27/26 (2006.01)
G01F 23/26 (2006.01)

(52) U.S. Cl.
CPC ....... G01N 27/223 (2013.01); G01R 27/2605 (2013.01); G01F 23/26 (2013.01)

(58) Field of Classification Search
CPC ........ G01N 27/00; G01N 27/02; G01N 27/22; G01N 27/221; G01N 27/223;
(Continued)

(56) References Cited

U.S. PATENT DOCUMENTS 5,103,368 A    4/1992    Hart
6,820,483 B1    11/2004    Beckerman
(Continued)

FOREIGN PATENT DOCUMENTS

ES    2530691 A1    3/2015

OTHER PUBLICATIONS

International Search Report dated Jul. 6, 2017 for PCT/ES2017/070214 and English translation.

*Primary Examiner* — Hoai-An D. Nguyen
(74) *Attorney, Agent, or Firm* — Lucas & Mercanti, LLP

(57) ABSTRACT

A method for detecting water in diesel fuel filters is disclosed by arranging a first electrode and a second electrode in a medium located in the diesel fuel filter, forming an equivalent parallel RC circuit; applying an injection phase (A), during which a closed first switch and an open second switch are arranged such that a working electric current is injected in the first electrode, and the second electrode is connected to ground, delivering an electric charge; applying a relaxation phase (B), during which the open first switch and the closed second switch are arranged such that both the first electrode and the second electrode are connected to ground, the electric charge being dissipated through the medium; evaluating the voltage according to a capacitive component of the equivalent parallel RC circuit; and determining the medium.

6 Claims, 3 Drawing Sheets

(58) Field of Classification Search
CPC .. G01N 27/226; G01N 27/227; G01N 27/228; G01N 2027/222; G01F 23/00; G01F 23/22; G01F 23/26; G01R 27/00; G01R 27/02; G01R 27/26; G01R 27/2605
USPC ....... 324/600, 649, 658, 663, 664, 665, 666, 324/686, 689
See application file for complete search history.

(56) References Cited

U.S. PATENT DOCUMENTS

| | | | |
|---|---|---|---|
| 10,274,445 B2* | 4/2019 | Diez Garcia | G01N 27/07 |
| 2011/0283886 A1* | 11/2011 | Ladha | B01D 46/0068 |
| | | | 95/278 |
| 2014/0157881 A1* | 6/2014 | Noda | F01N 3/0222 |
| | | | 73/114.71 |
| 2016/0237930 A1* | 8/2016 | Uchiyama | F01N 3/106 |
| 2018/0031505 A1* | 2/2018 | Diez Garcia | G01N 27/07 |

* cited by examiner

10,732,136 B2

METHOD FOR DETECTING WATER IN DIESEL FUEL FILTERS AND WATER SENSOR FOR CARRYING OUT SAID METHOD

CROSS REFERENCE TO RELATED APPLICATION

This Application is a 371 of PCT/ES2017/070214 filed on Apr. 6, 2017 which, in turn, claimed the priority of Spanish Patent Application No. P201630445 filed on Apr. 11, 2016, both applications are incorporated herein by reference.

TECHNICAL FIELD

The present invention is related to the sector of fuel filters for diesel engines, and more specifically to the sector of the water detection in fuel filters of diesel engines and proposes a method for carrying out this detection, along with a water sensor for applying said method.

STATE OF THE ART

The need to eliminate water contained in diesel fuel engines in order to prevent said water from coming into contact with sensitive elements of the injection systems of said engines, on which water can have a harmful effect due to corrosion, such as oxidation and the deposition of insoluble salts, is currently known.

In the use of diesel fuel filters, water is separated from the diesel fuel. The water that is separated from the diesel engine fuel is decanted and collected in a specific suitable area, which, due to the fact that water is denser than diesel fuel, is usually located in the lower part of the housing of diesel fuel filters.

Water sensors are arranged in diesel fuel filters. When the decanted water reaches a predetermined maximum level in the lower part of the diesel fuel filter housing, these sensors emit a warning signal. The warning signal indicates the need to perform an extraction of the collected water before damage is caused to the engine. For the detection of water, these sensors include two metal electrodes arranged in correspondence with the aforementioned lower part of the housing.

Detecting the accumulation of water that has been separated from diesel fuel in the water decanting area in diesel fuel filters by using complex water sensors, the effectiveness of said detection being extended by injecting an electric current in the electrodes in a non-continuous or intermittent way, is known. The water detection is a function of the value of the resistive component that is the medium in which the electrodes of the diesel fuel sensor in the diesel fuel filters are submerged.

Although by intermittently injecting electric current in the electrodes and analyzing the resistive component one can obtain an extension in the operational life of the water sensor to an significant degree, for example up to 40 times greater, compared to a water sensor powered by electric current in a continuous way, in the long run, it is inevitable that insoluble salts will form and be deposited on the electrodes. This leads to a slow increase in the value of the resistive component in the presence of a conductive medium (water, for example) until reaching values close to those characterizing an insulating medium (oil or diesel fuel, for example), such that the water sensor is unusable, and distinguishing between water and diesel fuel or oil is impossible.

In some types of vehicles, the operational life of water sensors with electric current injection in an intermittent way and the analysis of the resistive component may in some cases be sufficient. In other types of vehicles, however, the requirements for duration are much stricter, a typical example being a total operational time of 20,000 hours corresponding to 1,500,000 Km of distance driven, in which anywhere from 1,000 to 2,000 cases of the presence of water may occur with a total exposure time of between 1,000 and 2,000 hours. For these types of vehicles, it is especially necessary to have a method as well as a water sensor with an improved immunity to the formation of deposits on the electrodes.

It is therefore necessary to have a method, as well as a sensor, for detecting the presence of water in diesel fuel filters that increases the effectiveness against corrosion.

OBJECT OF THE INVENTION

The invention relates to a method for detecting water in diesel fuel filters and a water sensor to be used according to said method.

The method for detecting water in diesel fuel filters comprises the steps of: arranging a first electrode and a second electrode in a medium located in the diesel fuel filter, forming an equivalent parallel RC circuit; applying an injection phase, during which a closed first switch and an open second switch are arranged such that a working electric current is injected in the first electrode, and the second electrode is connected to ground, delivering an electric charge; applying a relaxation phase, during which the open first switch and the closed second switch are arranged such that both the first electrode and the second electrode are connected to ground, the electric charge being dissipated through the medium; evaluating the voltage according to a capacitive component of the equivalent parallel RC circuit; and determining the medium by means of the evaluation of the current according to the capacitive component.

According to that which was previously described, it is determined that the medium is a conductive medium when the voltage has an increasing value, the capacitive component being obtainable.

The method further comprises a calibration phase wherein the first electrode and the second electrode are located in a controlled insulating medium, a test electric current is injected and a rise time the voltage takes to reach a steady state is measured.

After the calibration phase, the evaluation of the voltage according to the capacitive component is carried out when the rise time has passed since the beginning of the injection of the working electric current in the injection phase. Alternatively, the evaluation of the voltage according to the capacitive component is carried out when the rise time in addition to a delay time has passed since the beginning of the injection of the working electric current in the injection phase.

The water sensor, in turn, comprises the first electrode, the second electrode, a connection to the current for the connection of the first electrode to a current source, a connection to ground for the connection of the second electrode to ground, an intermediate connection for the connection of the first electrode and the second electrode to one another, the first switch arranged in the connection to the current and the second switch arranged in the intermediate connection.

DETAILED DESCRIPTION OF THE INVENTION

The invention relates to a water sensor and a method for detecting water in diesel fuel filters by means of the use of said water sensor. The sensor comprises a very simple switching bridge, with respect to the number of components thereof and the arrangement of the same with regard to one another. The switching bridge is shown in FIG. 1.

Figure 1:
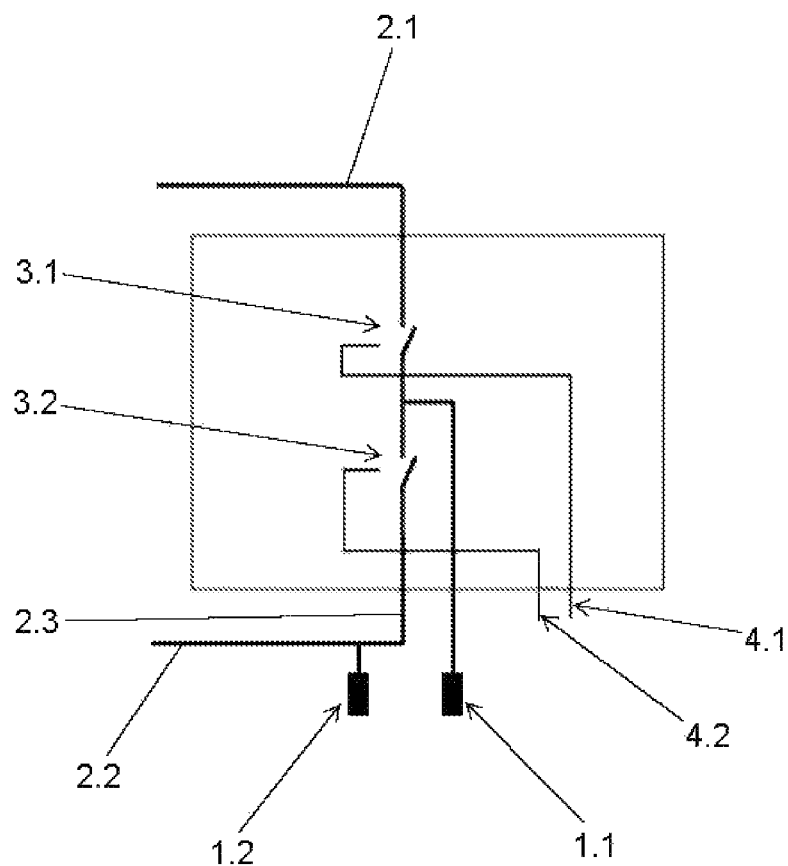
FIG. 1 shows a switching bridge in a schematic way, which is comprised in a water sensor object of the present invention.

In FIG. 1 we can see how the water sensor comprises two electrodes (1.1, 1.2) a first electrode (1.1) and a second electrode (1.2). Additionally, the water sensor comprises the a connection to the current (2.1) for the connection of the first electrode (1.1) to a current source (not shown in the figures), a connection to ground (2.2) for the connection of the second electrode (1.2) to ground, an intermediate connection (2.3) for the connection of the first electrode (1.1) and the second electrode (1.2) to one another, a first switch (3.1) arranged in the connection to the current (2.1) and a second switch (3.2) arranged in the intermediate connection (2.3).

With the water sensor being installed in the diesel fuel filter and the two electrodes (1.1, 1.2) submerged in a medium stored in the water decantation area of said filter, the two electrodes (1.1, 1.2) and the medium form a system, the equivalent circuit formed by said system being a parallel RC circuit.

The first switch (3.1) and the second switch (3.2) are governed by a first control signal (4.1) and a second control signal (4.2), respectively. The aforementioned switches (3.1, 3.2) are opened and closed by means of said control signals (4.1, 4.2). The water sensor additionally comprises a control unit configured for controlling the opening and closing of both the first switch (3.1) and the second switch (3.2) by means of the first control signal (4.1) and the second control signal (4.2). This configuration allows for two states of the water sensor, a connection state and a discharge state. The connection state and the discharge state correspond to an injection phase (A) and a relaxation phase (B), respectively.

In the injection phase (A), the first switch (3.1) is closed and the second switch (3.2) is open, such that the first electrode (1.1) is injected with a working electric current and the second electrode (1.2) is connected to ground. In the relaxation phase (B), the first switch (3.1) is open and the second switch (3.2) is closed, such that the first electrode (1.1) and the second electrode (1.2) are arranged connected to ground. This way, there is an alternation between injecting the working electric current in the first electrode (1.1), with the second electrode (1.2) being connected to ground, and the first electrode (1.1) and the second electrode (1.2) arranged connected to ground.

In the relaxation phase (B), a free discharge of the equivalent condenser "C" of the equivalent RC circuit is produced. In other words, during the injection phase (A) in which the working electric current is injected into the first electrode (1.1), an electric charge is provided, which dissipates in the medium in which the two electrodes (1.1, 1.2) are located during the immediately subsequent relaxation phase (B). This way, all of the chemical reactions linked to the electric charge are minimized or even eliminated.

The current source supplies pulses of working electric current with a specific polarity. However, at the level of the electrodes (1.1, 1.2), and due to the introduction of the relaxation phase (B) after each one of the injection phases (A), the direction of the working electric current at the level of the two electrodes (1.1, 1.2) is periodically inverted, providing the desired effects, a polarization in alternating current. The working electric current has a nominal value of between 1 and 11 µa.

Figure 2:
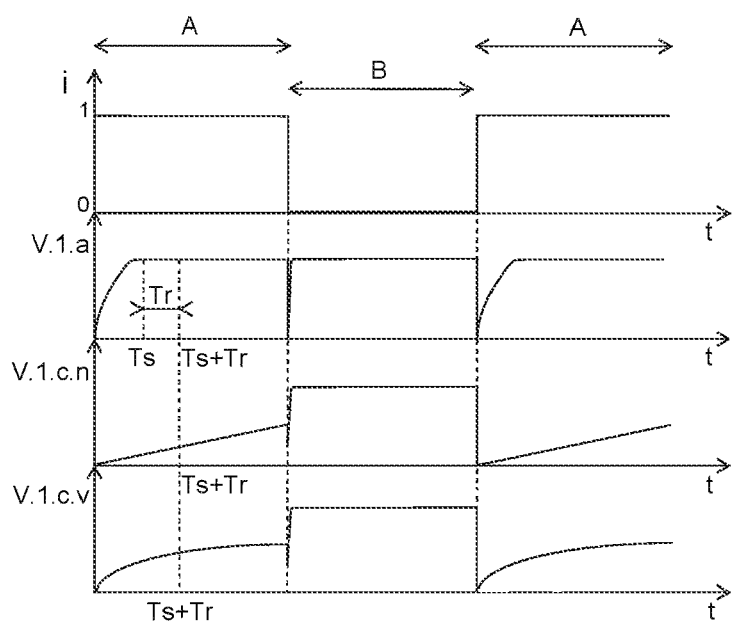
FIG. 2 graphically shows an injection signal of a working electric current over time, an evolution in the time of the voltage signal at the outlet of a current source in an insulating medium and an evolution over time of a voltage signal at the outlet of the current source in a conductive medium for the water sensor, the same being both new and old.
Figure 3:
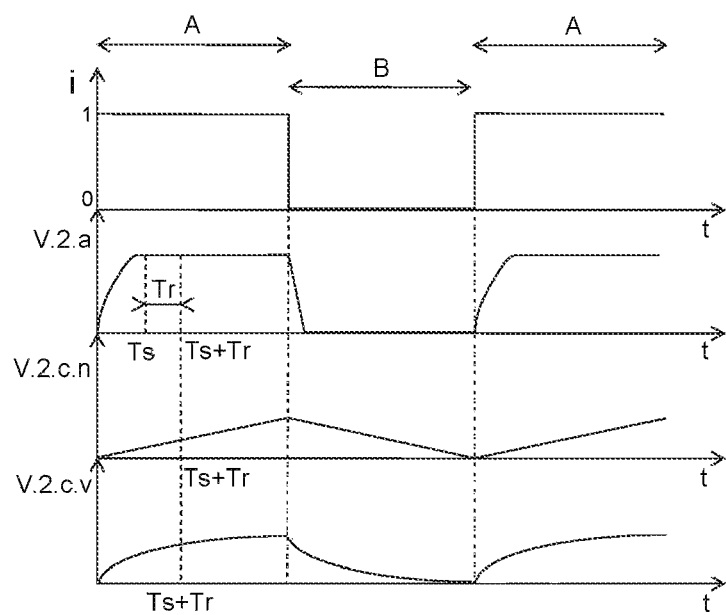
FIG. 3 graphically shows an injection signal of a working electric current over time, an evolution over time of the voltage signal between two electrodes in an insulating medium and an evolution over time of a voltage signal between the two electrodes in a conductive medium for the water sensor, the same being both new and being old

In FIGS. 2 and 3 one can see an injection signal (i) of the working current over time, such that it is perceivable when the working electric current is being injected into the first electrode (1.1), represented by a "1", and when said current is not being injected to the first electrode (1.1), represented by a "0".

In the injection phase (A) the presence of water in the medium in which the two electrodes (1.1, 1.2) are submerged is determined according to the capacitive component of the equivalent RC circuit. When the medium in which the two electrodes (1.1, 1.2) are located is an insulating medium, the value of the capacitive component is a smaller value than when the medium in which the two electrodes (1.1, 1.2) are located is a conductive medium.

The values of the capacitive component widely vary according to the geometric properties of the two electrodes (1.1, 1.2) used, but for a specific embodiment in which, for example, the two electrodes (1.1, 1.2) are cylindrical and arranged parallel to one another, spaced apart by 5 mm, the value of the capacitive component in an insulating medium can reach 100 pF, while this same configuration of the two electrodes (1.1, 1.2) submerged in a conductive medium provides a value of the capacitive component around a thousand times greater, and therefore, there is a very wide margin for distinguishing between the two. The values observed for the case of the resistive component, in turn, are around 25 MΩ for the insulating medium and 50 kΩ for the conductive medium. The difference obtained for a conductive medium and an insulating medium is clearly greater for the value of the capacitive component than for the value of the resistive component, which provides a greater determination of the medium in which the two electrodes (1.1, 1.2) are located.

According to another exemplary embodiment, the value of the capacitive component corresponding to an insulating medium is between 80 and 120 pF, or less, while the value of the capacitive component corresponding to a conductive medium is between 80 and 120 nF, or more. Preferably, when the value of the capacitive component is greater than 1 nF, it is determined that it is a conductive medium.

Tests have demonstrated that the value of the resistive component for a conductive medium tends to increase, becoming similar to values corresponding to an insulating medium as a consequence of the deposition of insoluble salts. This is due to the fact that the deposition of insoluble salts causes diesel fuel to be absorbed, resulting in an insulating layer that covers at least one of the two electrodes (1.1, 1.2) and thus the water sensor obtains erroneous measurements from the resistive component when the two electrodes (1.1, 1.2) are submerged in water.

The value of the capacitive component, in turn, is immune, or at least significantly less affected by the deposition of insoluble salts. Thus, the present invention offers a high capability of water detection, even with the repeated use of the method and the water sensor, and at the same time offers a high degree of simplicity in the constitution of the water sensor.

For a specific determination of the presence of water according to the capacitive component, it is necessary to evaluate the voltage at a moment in which the voltage is in a transient state, such that the value of the capacitive component may be obtained, since if the voltage enters the steady or permanent state, the value of the capacitive component is not obtainable or measurable given that when the voltage enters the steady state the signal of the voltage becomes stable, and as a result, becomes dependent only on the resistive component.

For evaluating the voltage, the same is preferably measured at the outlet of the current source, in other words, at a first point corresponding to the connection to the current (2.1). FIG. 2 shows, in a graphic and simplified way, an evolution over time of a first voltage signal (V.1$a$) corresponding to the voltage measured in the connection to the current (2.1) in an insulating medium, the water sensor being new, an evolution over time of a second voltage signal (V.1.$c.n$) corresponding to the voltage measured in the connection to the current (2.1) in a conductive medium, the sensor being new, and an evolution over time of a third voltage signal (V.1.$c.v$) corresponding to the voltage measured in the connection to the current (2.1) in a conductive medium, the water sensor being old, meaning after the same has been used.

Alternatively, for evaluating the voltage, the same is measured at a second point between the first switch (3.1) and the second switch (3.2), in other words, the voltage corresponding to the voltage between the two electrodes (1.1, 1.2) is measured. FIG. 3 shows, in a graphic and simplified way, an evolution over time of a fourth voltage signal (V.2.$a$) corresponding to the voltage measured between the two electrodes (1.1, 1.2) in an insulating medium, the water sensor being new, an evolution over time of a fifth voltage signal (V.2.$c.n$) corresponding to the voltage between the two electrodes (1.1, 1.2) in a conductive medium, the sensor being new, and an evolution over time of a sixth voltage signal (V.2.$c.v$) corresponding to the voltage between the two electrodes (1.1, 1.2) in a conductive medium, the water sensor being old, meaning after the same has been used.

Accordingly, the evaluation of the voltage according to the capacitive component is done in an initial part of the injection phase (A). In other words, the evaluation of the voltage according to the capacitive component can be carried out at the moment in which a wait time has passed since the beginning of the injection of the working electric current in the injection phase (A). The wait time is established between 100 and 250 milliseconds or, alternatively, it is established by means of a calibration phase.

The method comprises the calibration phase for an optimization of the same. According to the calibration phase, the water sensor is arranged such that the two electrodes (1.1, 1.2) are located in a controlled, in other words, known, insulating medium. To this end, the water sensor can be installed or mounted in the corresponding diesel fuel filter. The controlled insulating medium is preferably diesel fuel. Alternatively, this insulating medium can be oil, or even air, by having a permittivity similar to that of diesel fuel.

Subsequently, a test electric current is injected in pulses to the first electrode (1.1) and, by means of the control unit, a measurement of the time required by the voltage to reach the steady state in the described conditions is carried out, which is called rise time (Ts). The rise time corresponds to the previously described wait time. Therefore, the voltage is preferably measured at the first point corresponding to the connection to the current (2.1). The rise time (Ts) is stored in an internal memory comprised in the water sensor. For subsequent evaluations after the calibration phase of the voltage, said rise time (Ts) is taken into consideration. The test electric current is preferably a nominal value in the range of 1 to 11 μa, such that the test electric current and the working electric current can be the same.

The diesel fuel has a smaller capacity than water, and therefore a smaller time constant than water. In other words, the voltage reaches the steady or permanent state significantly earlier in time in the case of an insulating medium than in a conductive medium.

This way, by the water sensor being in use after the wait time is established, when said time has passed and the voltage is evaluated, if a constant voltage value over time is obtained, it is considered that the voltage has reached the steady state, the value of the capacitive component not being obtainable, and it is determined that the medium in which the two electrodes (1.1, 1.2) are located is an insulating medium; whereas if the value of the increasing voltage over time is obtained, it is considered that the voltage is in the transient state, the value of the capacitive component being obtainable, and it is determined that the medium in which the two electrodes (1.1, 1.2) are located is a conductive medium. In this latter case, the value of the capacitive component obtained is high, in other words, it is a value closer to 1 nF than to 1 pF. To know if the voltage measured is increasing or remaining constant, the voltage signal measured is digitally treated using means comprised in the sensor that are configured for such purpose.

For a greater optimization of the method, the evaluation of the voltage according to the capacitive component is carried out at the moment in which a wait time in addition to an additional wait time has passed since the beginning of the injection of the working electric current in the injection phase (A). This additional wait time, named delay time (Tr), is due to, for example, the fact the required time for that for the water sensor to reach the steady state both in an insulating medium and in a conductive medium can vary according to the diverse characteristic aspects of the water sensor. Some of these aspects are the: geometric construction of the water sensor and manufactured tolerances of the components comprised in the water sensor. The value of the delay time (Tr) is preferably comprised in a range of 15 to 25 milliseconds.

In FIGS. 2 and 3 one can also see that the method can additionally comprise adapting the injection frequency of the working electric current so that the duration of the injection phases (A) is such that the voltage is always in the steady state when in a conductive medium, for example, water. This way, the useful life of the water sensor is extended.

By means of the present water sensor, a sensor that is very simple is provided. This simplicity leads to a reduction in the total costs, both with regard to the number of components and the required manufacturing process. By means of the present method, a high degree of effectiveness is provided in the detection of water in diesel fuel filters, due, among other reasons, to the simplicity of the water sensor used. Moreover, since said detection is based on the measurement and analysis of the capacitive component of the equivalent RC circuit, a greater extension of the useful life of the water sensor is provided.

The invention claimed is:

1. A method for detecting water in diesel fuel filters, comprising the steps of:
   arranging a first electrode and a second electrode in a medium located in a diesel fuel filter forming an equivalent parallel RC circuit;
   applying an injection phase (A), in which a closed first switch and an open second switch are arranged, such that a working electric current is injected into the first electrode and the second electrode is connected to ground, providing an electric charge;
   applying a relaxation phase (B), in which the open first switch and the closed second switch are arranged such that both the first electrode and the second electrode are arranged connected to ground, the electric charge being dissipated in the medium;
   evaluating the voltage according to a capacitive component of the equivalent parallel RC circuit; and
   determining the medium by means of the evaluation of the voltage according to the capacitive component.

2. The method according to claim 1, wherein it is determined that the medium is a conductive medium when the voltage has an increasing value, the capacitive component being obtainable.

3. The method according to claim 1, wherein it further comprises a calibration phase wherein the first electrode and the second electrode are located in a controlled insulating medium, a test electric current is injected and a rise time (Ts) the voltage takes to reach steady state is measured.

4. The method according to claim 3, wherein the evaluation of the voltage according to the capacitive component is carried out when the rise time (Ts) has passed since the beginning of the injection of the working electric current in the injection phase (A).

5. The method according to claim 3, wherein the evaluation of the voltage according to the capacitive component is carried out when the rise time (Ts) in addition to a delay time (Tr) has passed since the beginning of the injection of the working electric current in the injection phase (A).

6. A water sensor used in f r applying the method according to claim 1, comprising
   a first electrode,
   a second electrode,
   a first connection to a current for connecting the first electrode to a current source,
   a second connection to ground for connecting the second electrode to ground,
   an intermediate connection for connecting the first electrode and the second electrode to one another,
   a first switch arranged in the first connection to the current and
   a second switch arranged in the intermediate connection, wherein
      the first electrode and the second electrode are arranged in the medium located in the diesel fuel filter forming the equivalent parallel RC circuit;
      the injection phase (A) is applied, in which the closed first switch and the open second switch are arranged, such that the working electric current is injected into the first electrode and the second electrode is connected to ground, providing the electric charge;
      a relaxation phase (B) is applied, in which the open first switch and the closed second switch are arranged such that both the first electrode and the second electrode are arranged connected to ground, the electric charge being dissipated in the medium;
      the voltage according to the capacitive component of the equivalent parallel RC circuit is evaluated; and
      the medium is determined by means of the evaluation of the voltage according to the capacitive component.

* * * * *